(12) United States Patent
Hou (10) Patent No.: US 10,879,322 B2
(45) Date of Patent: Dec. 29, 2020

(54) PIXEL DEFINITION LAYER, ORGANIC LIGHT-EMITTING DEVICE AND MANUFACTURING METHOD THEREOF, DISPLAY APPARATUS

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/070,405

(22) PCT Filed: Nov. 24, 2017

(86) PCT No.: PCT/CN2017/112825
§ 371 (c)(1),
(2) Date: Jul. 16, 2018

(87) PCT Pub. No.: WO2018/171238
PCT Pub. Date: Sep. 27, 2018

(65) Prior Publication Data
US 2019/0267437 A1    Aug. 29, 2019

(30) Foreign Application Priority Data
Mar. 24, 2017   (CN) .......................... 2017 1 0181078

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 51/5012* (2013.01); *H01L 51/5088* (2013.01); *H01L 51/56* (2013.01)

(58) Field of Classification Search
CPC .................................................. H01L 27/3246
(Continued)

(56) References Cited

U.S. PATENT DOCUMENTS 9,490,443 B2   11/2016   Joo et al.
9,525,013 B2   12/2016   Xu et al.
(Continued)

FOREIGN PATENT DOCUMENTS

CN   103887321 A   6/2014
CN   103941512 A   7/2014
(Continued)

OTHER PUBLICATIONS

International Search Report and Written Opinion dated Feb. 24, 2018.
(Continued)

*Primary Examiner* — Hsin Yi Hsieh
(74) *Attorney, Agent, or Firm* — Dilworth & Barrese, LLP; Michael J. Musella, Esq.

(57) ABSTRACT

A pixel definition layer is provided. The pixel definition layer includes: a base definition layer having a plurality of openings for defining pixel regions, and a first definition leer arranged on a side surface of at least one of the openings of the base definition layer, and a hydrophilic property of the base definition layer is different from a hydrophilic property of the first definition layer.

16 Claims, 5 Drawing Sheets

(58) Field of Classification Search
USPC ........................................................ 257/40
See application file for complete search history.

(56) References Cited

U.S. PATENT DOCUMENTS

| | | | |
|---|---|---|---|
| 9,704,935 B2 | 7/2017 | Kim | |
| 10,126,544 B2 | 11/2018 | He et al. | |
| 2003/0222267 A1 | 12/2003 | Kim et al. | |
| 2005/0057151 A1* | 3/2005 | Kuwabara | H01L 27/3246 313/506 |
| 2006/0119259 A1 | 6/2006 | Bae et al. | |
| 2010/0090195 A1* | 4/2010 | Parsapour | H01L 51/502 257/13 |
| 2013/0277649 A1* | 10/2013 | Gregory | H01L 27/3246 257/40 |
| 2016/0020424 A1 | 1/2016 | Kim et al. | |
| 2016/0133676 A1 | 5/2016 | Kim | |

FOREIGN PATENT DOCUMENTS

| | | |
|---|---|---|
| CN | 104037357 A | 9/2014 |
| CN | 104167430 A | 11/2014 |
| CN | 104253244 A | 12/2014 |
| CN | 104752490 A | 7/2015 |
| CN | 104979484 A | 10/2015 |
| CN | 105511073 A | 4/2016 |
| CN | 105826358 A | 8/2016 |
| CN | 106024827 A | 10/2016 |
| EP | 2254394 A1 | 10/2009 |
| WO | 2005051049 A1 | 2/2005 |

OTHER PUBLICATIONS

First Office Action in corresponding Chinese application No. 201710181078.1 dated Mar. 13, 2020 and English translation.
Extended European Search Report dated Oct. 8, 2020.

* cited by examiner

PIXEL DEFINITION LAYER, ORGANIC LIGHT-EMITTING DEVICE AND MANUFACTURING METHOD THEREOF, DISPLAY APPARATUS

The present application claims the priority of the Chinese Patent Application No. 201710181078.1 filed on Mar. 24, 2017, which is incorporated herein by reference as part of the disclosure of the present application.

TECHNICAL FIELD

Embodiments of the present disclosure relate to a pixel definition layer and its manufacturing method, organic light-emitting device and its manufacturing method, and a display apparatus.

BACKGROUND

Organic light-emitting diodes (OLEDs) are organic thin film light-emitting devices, which have advantages of simple preparation process, low cost, high light-emitting efficiency and easy to implement in a flexible structure, and therefore organic light-emitting diode display technology has become an important display technology.

Methods for forming organic light-emitting layers in the organic light-emitting diodes include a vacuum evaporation method and a solution method. The vacuum evaporation method is suitable for organic small molecule material. The organic light-emitting diodes are formed without solvent by the vacuum evaporation method, and a thickness of each of the organic light-emitting layers is uniform, but the equipment cost for forming the organic light-emitting layers is high, an utilization rate of materials is low, and the solution method is not suitable for producing large size products. The solution method includes a spin coating method, an inkjet printing method, a nozzle coating method, etc, and the solution method is suitable for polymer materials and soluble small molecules. The solution method has characteristics such as low equipment cost, and has outstanding advantages in large scale production of large size products. Especially, the inkjet printing technology can accurately spray solution into a pixel region to form an organic functional layer. However, the biggest difficulty of the inkjet printing technology is to form a film with a uniform thickness in the pixel region.

SUMMARY

At least one embodiment of the present disclosure provides a pixel definition layer, and the pixel definition layer comprises: a base definition layer having a plurality of openings for defining pixel regions, and a first definition layer arranged on a side surface of at least one of the openings of the base definition layer, and a hydrophilic property of the base definition layer is different from a hydrophilic property of the first definition layer.

For example, the pixel definition layer provided by at least one embodiment of the present disclosure, further comprises: a second definition layer arranged on a side surface of at least one of the openings of the base definition layer; the hydrophilic property of the base definition layer, the hydrophilic property of the first definition layer, and a hydrophilic property of the second definition layer are different from each other.

For example, in the pixel definition layer provided by at least one embodiment of the present disclosure, a material of the base definition layer comprises a hydrophilic material or a first hydrophobic material, a material of the first definition layer comprises a second hydrophobic material, and a material of the second definition layer comprises a third hydrophobic material.

For example, in the pixel definition layer provided by at least one embodiment of the present disclosure, the first hydrophobic material comprises at least one of fluorinated polyimide, fluorinated polymethyl methacrylate and fluorinated organosilicon; the second hydrophobic material comprises at least one of fluorinated polyimide, fluorinated polymethyl methacrylate and fluorinated organosilicon; and the third hydrophobic material comprises at least one of fluorinated polyimide, fluorinated polymethyl methacrylate and fluorinated organosilicon.

For example, in the pixel definition layer provided by at least one embodiment of the present disclosure, in a case that the first hydrophobic material is same as the second hydrophobic material or the third hydrophobic material in base material but different from the second hydrophobic material or the third hydrophobic material in fluorination rate, and a ratio of fluorinated group to non-fluorinated group of the first hydrophobic material is less than that of the second hydrophobic material and that of the third hydrophobic material.

For example, in the pixel definition layer provided by at least one embodiment of the present disclosure, the hydrophilic material comprises an inorganic hydrophilic material or an organic hydrophilic material, the inorganic hydrophilic material comprises at least one of $SiO_2$, $SiN_x$ and $SiON_x$, and the organic hydrophilic material comprises at least one of polyimide, polymethyl methacrylate and organosilicon resin.

For example, in the pixel definition layer provided by at least one embodiment of the present disclosure, a first contact angle of deionized water on the base definition layer is less than a second contact angle of deionized water on the first definition layer or the second definition layer, and the second contact angle is larger than the first contact angle by 30 to 90 degrees.

For example, in the pixel definition layer provided by at least one embodiment of the present disclosure, a thickness of the base definition layer is from 3 μm to 50 μm, and thicknesses of the first definition layer and the second defined layer are from 1 μm to 3 μm.

For example, the pixel definition layer provided by at least one embodiment of the present disclosure, further comprises: a third definition layer arranged on a side surface of at least one of the openings of the base definition layer, and the openings for arranging the first definition layer, the second definition layer and the third definition layer are arranged in sequence or spaced apart from each other.

At least one embodiment of the present disclosure further provides an organic light-emitting device, and the organic light-emitting device comprises: a base substrate; any one of the pixel definition layer described above arranged on the base substrate; and an organic functional layer disposed in the plurality of openings of the base definition layer.

For example, in the organic light-emitting device provided by at least one embodiment of the present disclosure, the organic functional layer comprises a hole injection layer and an organic light-emitting layer which are stacked.

For example, in the organic light-emitting device provided by at least one embodiment of the present disclosure, a material of the hole injection layer comprises polyaniline conducting polymers or polythiophene conducting polymers with at least one of alcohols, ethers and esters.

For example, in the organic light-emitting device provided by at least one embodiment of the present disclosure, a third contact angle of the material of the hole injection layer on the base definition layer is 0 to 50 degrees, a fourth contact angle of the material of the hole injection layer on the first definition layer is 30 to 90 degrees, a fifth contact angle of the hole injection layer on the second definition layer is 30 to 90 degrees, and a difference between the fourth contact angle and the fifth contact angle is 0 to 10 degrees.

At least one embodiment of the present disclosure further provides a display apparatus, and the display apparatus comprises: any one of the organic light-emitting device described above.

At least one embodiment of the present disclosure further provides a manufacturing method of a pixel definition layer, and the manufacturing method comprises: forming a base definition layer having a plurality of openings for defining pixel regions, and forming a first definition layer on a side surface of at least one of the openings of the base definition layer, and a hydrophilic property of the base definition layer is different from a hydrophilic property of the first definition layer.

For example, in the manufacturing method provided by at least one embodiment of the present disclosure, the method further comprises: forming a second definition layer on a side surface of at least one of the openings of the base definition layer, the hydrophilic property of the base definition layer, the hydrophilic property of the first definition layer, and a hydrophilic property of the second definition layer are different from each other.

At least one embodiment of the present disclosure further provides a manufacturing method of an organic light-emitting device, and the method further comprises: providing a base substrate; forming any one of the pixel definition layers described above on the base substrate; and forming an organic functional layer in the plurality of openings of the base definition layer.

For example, in the manufacturing method provided by at least one embodiment of the present disclosure, the organic functional layer comprises a hole injection layer and an organic light-emitting layer which are stacked.

For example, in the manufacturing method provided by at least one embodiment of the present disclosure, a third contact angle of a material of the hole injection layer on the base definition layer is 0 to 50 degrees, a fourth contact angle of the material of the hole injection layer on the first definition layer is 30 to 90 degrees, a fifth contact angle of the hole injection layer on the second definition layer is 30 to 90 degrees, and a difference between the fourth contact angle and the fifth contact angle is 0 to 10 degrees.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
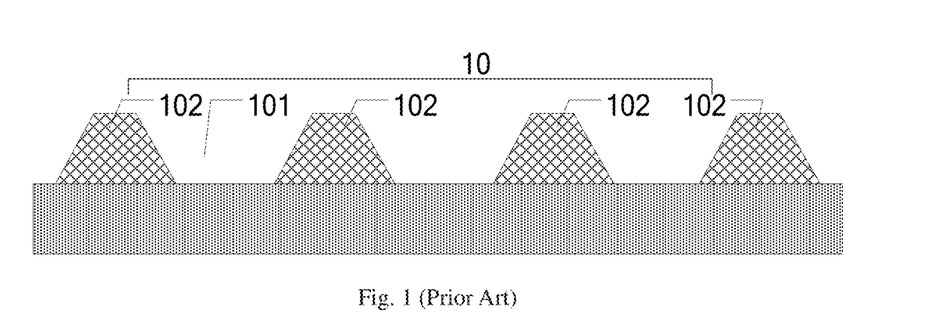
FIG. 1 is a schematic diagram of a sectional structure of a pixel definition layer.

In a process of preparing an organic light-emitting device, light-emitting layers of different colors (such as a red light-emitting layer, a green light-emitting layer, or a blue light-emitting layer) are required to be prepared to achieve a function of full color display. For the light-emitting layers of different colors, materials of hole transport layers best matching with the light-emitting layers of different colors respectively are selected. In this way, materials of hole injection layers best matching with the hole transport layers respectively are selected, and materials of pixel definition layers best matching with the hole injection layers respectively are selected. In this way, for the light-emitting layers of different colors, the materials of the hole injection layer, the hole transport layer and the pixel definition layer that match well with the light-emitting layers of different colors respectively are different. For example, FIG. 1 is a schematic diagram of a sectional structure of a pixel definition layer. The pixel definition layer 10 is made of a same material, and the pixel definition layer 10 has a plurality of openings 101. The pixel definition layer illustrated in FIG. 1 is unable to achieve a property of well matching with all of the hole injection layers corresponding to the light-emitting layers of different colors, which leads to an uneven film formation of a portion of the hole injection layers, affects the light-emitting efficiency of the device including the pixel definition layer and shortens the life of the device including the pixel definition layer.

The inventor of the present disclosure notes that the surface of the pixel definition layer contacting with the hole injection layer may be made of different materials to adapt to the hole injection layers made of different materials, in this way, the pixel definition layer matches well with each of the hole injection layers corresponding to the light-emitting layers of different colors, the hole injection layers are even, and light-emitting efficiency of the device including the pixel definition layer is improved and life of the device including the pixel definition layer is prolonged.

At least one embodiment of the present disclosure provides a pixel definition layer, and the pixel definition layer comprises: a base definition layer having a plurality of openings for defining pixel regions, and a first definition layer arranged on a side surface of at least one of the openings of the base definition layer, and a hydrophilic property of the base definition layer is different from a hydrophilic property of the first definition layer. Because the first definition layer is arranged on the side surface of at least one of the openings of the base definition layer, and the hydrophilic property of the base definition layer is different from the hydrophilic property of the first definition layer, the pixel definition layer adapts to the hole injection layer formed by different materials more widely, and the hole injection layers become more even, the light-emitting efficiency of the device including the pixel definition layer is improved and the life of the device including the pixel definition layer is prolonged.

Figure 2:
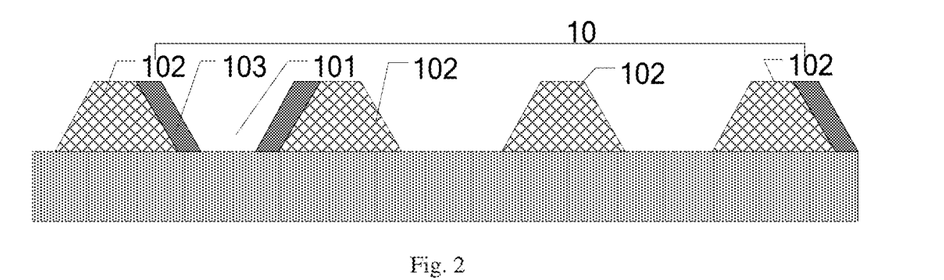
FIG. 2 is a schematic diagram of a sectional structure of a pixel definition layer provided by at least one embodiment of the present disclosure.

At least one embodiment of the present disclosure provides a pixel definition layer, for example, FIG. 2 is a schematic diagram of a sectional structure of a pixel definition layer provided by at least one embodiment of the present disclosure. As illustrated in FIG. 2, the pixel definition layer 10 comprises: a base definition layer 102 having a plurality of openings 101 for defining pixel regions, and a first definition layer 103 arranged on a side surface of at least one of the openings 101 of the base definition layer 102, and a hydrophilic property of the base definition layer 102 is different from a hydrophilic property of the first definition layer 103. In at least one embodiment of the present disclosure, the base definition layer 102 and the first definition layer 103 are made of different materials, in this way, the pixel definition layer adapts to the hole injection layer formed by different materials more widely, and the hole injection layers become more even, the light-emitting efficiency of the device including the pixel definition layer is improved and the life of the device including the pixel definition layer is prolonged.

It should be noted that, the base definition layer is the main portion of the pixel definition layer, the first definition layer is arranged on the side surface of at least one of the openings of the base definition layer to change the material of the contact surface of the pixel definition layer contacting with the corresponding hole injection layer. In this way, the base definition layer and the first definition layer made of different materials match well with the hole injection layers made of different materials.

The plane shape of each of the openings in the base definition layer is in a long strip shape, or the plane shape of each of the openings in the base definition layer is a rectangular, a square, or a triangle, etc, and therefore the plane shape of the base definition layer as a whole is in a grid shape, etc. Each of the openings, for example, is used for forming one or more sub-pixels. The plane shape of each of the openings in the base definition layer is not limited in the embodiment of the present disclosure.

For example, a first sub-pixel, a second sub-pixel and a third sub-pixel are formed in the corresponding regions of the plurality of openings 101 of the pixel definition layer respectively. For example, the first sub-pixel, the second sub-pixel and the third sub-pixel correspond to a red sub-pixel, a green sub-pixel and a blue sub-pixel respectively. Because a red light-emitting layer, a green light-emitting layer, and a blue light-emitting layer corresponding to the red sub-pixel, the green sub-pixel and the blue sub-pixel respectively are made of different materials, different materials for forming the hole transport layers are required to match with the corresponding light-emitting layers. In this way, the materials of the hole injection layers corresponding to the light-emitting layers of different colors respectively are different, and the materials of the pixel definition layers corresponding to the light-emitting layers of different colors are also different.

For example, as illustrated in FIG. 2, the first definition layers 103 are arranged in the openings 101 which are spaced apart from each other. In this way, the first definition layer 103 and the base definition layer 102 are made of different materials to adapt to the hole injection layers made of different materials.

Figure 3:
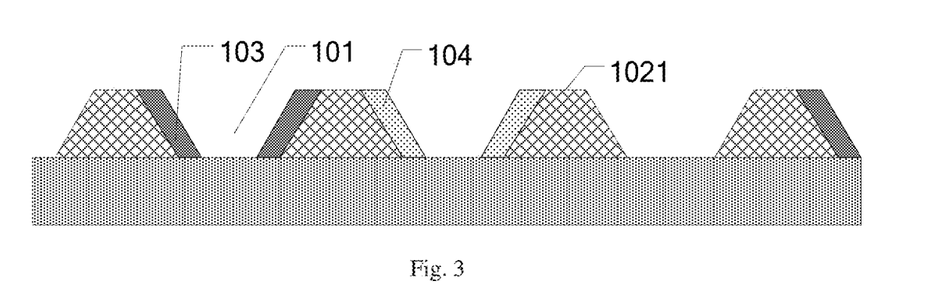
FIG. 3 is a schematic diagram of the sectional structure of another pixel definition layer provided by at least one embodiment of the present disclosure.

For example, FIG. 3 is a schematic diagram of the sectional structure of another pixel definition layer provided by at least one embodiment of the present disclosure. As illustrated in FIG. 3, the pixel definition layer 10 further comprises: a second definition layer 104 arranged on a side surface of another opening 101 of the base definition layer 102, the hydrophilic property of the base definition layer 102, the hydrophilic property of the first definition layer 103, and the hydrophilic property of the second definition layer 104 are different from each other.

For example, the first definition layer 103 and the second definition layer 104 are disposed in different openings 101 to adapt to the materials of the hole injection layers corresponding to the light-emitting layers of different colors. For example, as illustrated in FIG. 3, the first definition layer 103 and the second definition layer 104 are disposed in the openings 101 adjacent to each other, in this way, the first definition layer 103 and the second definition layer 104 are respectively formed on both sides of a sub-structure 1021 of the base definition layer 102 between two adjacent openings 101, and the first definition layer 103 and the second definition layer 104 are made of different materials.

Figure 4:
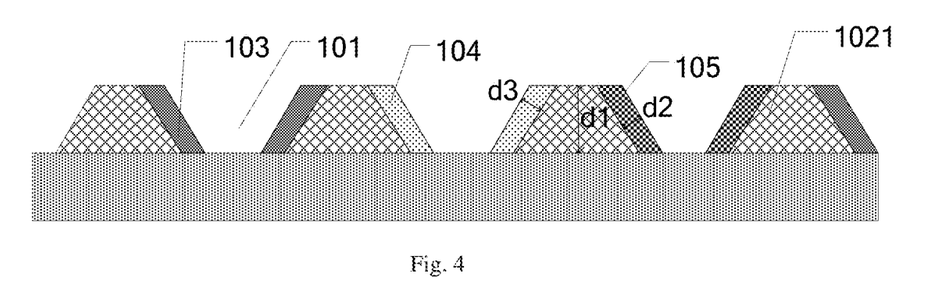
FIG. 4 is a schematic diagram of the sectional structure of still another pixel definition layer provided by at least one embodiment of the present disclosure.

For example, FIG. 4 is a schematic diagram of the sectional structure of still another pixel definition layer provided by at least one embodiment of the present disclosure. The pixel definition layer 10 further comprises: a third definition layer 105 arranged on a side surface of still another opening 101 of the base definition layer 102. As illustrated in FIG. 4, the openings 101, in which the first definition layer 103, the second definition layer 104 and the third definition layer 105 are arranged respectively, are arranged in sequence, or spaced apart from each other. For example, the hydrophilic property of the first definition layer 103, the hydrophilic property of the second definition layer 104 and the hydrophilic property of the third definition layer 105 are different from each other.

It should be noted that, the first definition layer and the second definition layer are relative, as long as the material of the first definition layer is different from the material of the second definition layer, and the first definition layer and the second definition layer are formed in different openings. One of them is called as the first definition layer and the other one is called as the second definition layer, and this rule also applies to the third definition layer. The following takes the first definition layer and the second definition layer for example, and the embodiments of the present disclosure are not limited to this situation.

For example, a material of the base definition layer 103 comprises a hydrophilic material or a first hydrophobic material, a material of the first definition layer comprises a second hydrophobic material, and a material of the second definition layer comprises a third hydrophobic material.

For example, all of the first hydrophobic material, the second hydrophobic material and the third hydrophobic material comprise at least one of fluorinated polyimide, fluorinated polymethyl methacrylate and fluorinated organosilicon. For example, the first hydrophobic material, the second hydrophobic material and the third hydrophobic material are selected from a same selection range, but the specific components are different, and the difference in components includes the selected different base materials. For example, the first hydrophobic material comprises at least one of fluorinated polyimide, fluorinated polymethyl methacrylate and fluorinated organosilicon; the second hydrophobic material comprises at least one of fluorinated polyimide, fluorinated polymethyl methacrylate and fluorinated organosilicon; and the third hydrophobic material comprises at least one of fluorinated polyimide, fluorinated polymethyl methacrylate and fluorinated organosilicon, or the base material of the first hydrophobic material is the same as the base material of the second hydrophobic material or the base material of the third hydrophobic material, but a fluorination rate of the base material of the first hydrophobic material is different from a fluorination rate of the base material of the second hydrophobic material or a fluorination rate of the base material of the third hydrophobic material. For example, all of the first hydrophobic material, the second hydrophobic material and the third hydrophobic material are fluorinated polyimide, and the ratio of fluorinated group to non-fluorinated group of the first hydrophobic material is different from that of the second hydrophobic material and from that of the third hydrophobic material.

For example, in a case that the base material of the first hydrophobic material is the same as the base material of the second hydrophobic material and the base material of the third hydrophobic material, and the fluorination rate of the base material of the first hydrophobic material is different from the fluorination rate of the base material of the second hydrophobic material and the fluorination rate of the base material of the third hydrophobic material, the ratio of fluorinated group to non-fluorinated group of the first hydrophobic material is less than that of the second hydrophobic material and that of the third hydrophobic material.

For example, in a case that the first hydrophobic material, the second hydrophobic material and the third hydrophobic material are selected from polyimide, the ratio of fluorinated group to non-fluorinated group of the first hydrophobic material is (0.8 to 1.2):10, the ratio of fluorinated group to non-fluorinated group of the second hydrophobic material is (1.8 to 2.2):10, the ratio of fluorinated group to non-fluorinated group of the third hydrophobic material is (2.8 to 3.2):10.

For example, in a case that the base materials of the first hydrophobic material, the second hydrophobic material and the third hydrophobic material are selected from polymethyl methacrylate or organosilicon, the ratio of fluorinated group to non-fluorinated group of the first hydrophobic material is (0.8 to 1.2):10, the ratio of fluorinated group to non-fluorinated group of the second hydrophobic material is (1.8 to 2.2):10, the ratio of fluorinated group to non-fluorinated group of the third hydrophobic material is (2.8 to 3.2):10, respectively.

For example, in at least one embodiment of the present disclosure, the hydrophilic material comprises an inorganic hydrophilic material or an organic hydrophilic material, the inorganic hydrophilic material comprises at least one of $SiO_2$, $SiN_x$ and $SiON_x$, and the organic hydrophilic material comprises at least one of polyimide, polymethyl methacrylate and organosilicon resin.

For example, a first contact angle of deionized water on the base definition layer is less than a second contact angle of deionized water on the first definition layer or the second definition layer, and the second contact angle is larger than the first contact angle by 30 to 90 degrees. For example, the second contact angle is larger than the first contact angle by 30 degrees, 40 degrees, 45 degrees, 55 degrees, 75 degrees or 90 degrees.

It should be noted that, in a case that a droplet is not fully expanded on the solid surface, the contact angle in the embodiment of the present disclosure refers to a liquid contact angle, and the liquid contact angle is an angle between a horizontal line of a liquid-solid interface and a tangent line of a gas-the liquid interface at a gas-liquid-solid phase confluence point that pass through an inside of the liquid.

For example, a longitudinal section of a sub-structure 1021 of the base definition layer is a trapezoidal or a shape having flat angles with circular arc. The longitudinal section of the sub-structure 1021 of the base definition layer are formed as the trapezoidal or the shape having flat angles with circular arc to reduce a step difference, in this way, it is more beneficial to form a uniformity film. It should be noted that, the longitudinal section of the base definition layer may also be of other suitable shapes, such as, a rectangular, an irregular quadrilateral, and so on, which is not limited here.

For example, a thickness of the base definition layer is from 3 μm to 50 μm, for example, 4 μm, 10 μm, 20 μm, 35 μm, or 49 μm. For example, as illustrated in FIG. 4, the reference d1 indicated by a bi-directional arrow is the thickness of the base definition layer.

For example, both a thickness of the first definition layer and a thickness of the second definition layer are from 1 μm to 3 μm, for example, both the thickness of the first definition layer and the thickness of the second definition layer are 1 μm, 2 μm, or 3 μm, the references d2 and d3 indicated by bi-directional arrows are thicknesses of the first definition layer and the second definition layer respectively.

Figure 5:
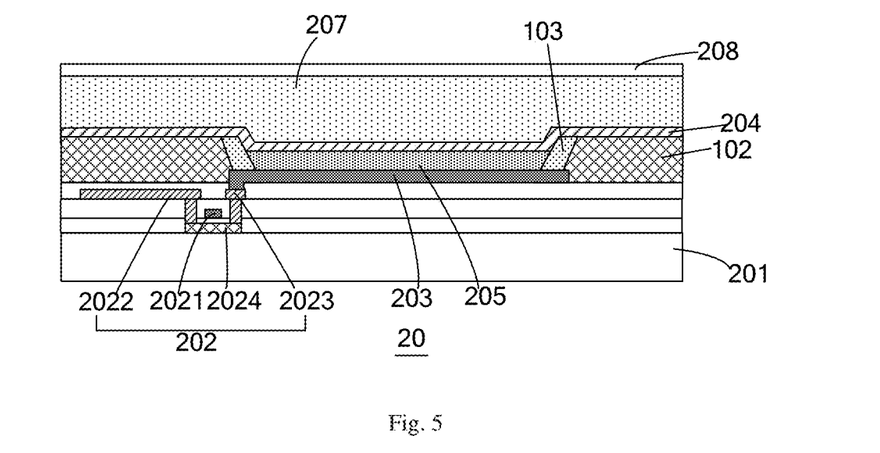
FIG. 5 is a schematic diagram of a sectional structure of an organic light-emitting device provided by at least one embodiment of the present disclosure.

At least one embodiment of the present disclosure further provides an organic light-emitting device, and for example, FIG. 5 is a schematic diagram of a sectional structure of an organic light-emitting device provided by at least one embodiment of the present disclosure. As illustrated in FIG. 5, the organic light-emitting device 20 comprises: a base substrate 201; a pixel definition layer 10 disposed on the base substrate 201, the pixel definition layer 10 is any one of the above mentioned pixel definition layers 10; and an organic functional layer 205 disposed in the plurality of openings 101 of the base definition layer 102.

For example, the organic light-emitting device 20 further comprises a pixel driving circuit arranged on the base substrate 201. The pixel driving circuit comprises a driving transistor 202, a first electrode 203, a second electrode 204, a passivation layer 207, and an encapsulation layer 208. The driving transistor 202 comprises a gate electrode 2021, a source electrode 2022, a drain electrode 2023, and an active layer 2024. The first electrode 203 is connected with the source electrode 2022 or the drain electrode 2023 of the driving transistor 202. The first electrode 203 is an anode, and the second electrode 204 is a cathode; or the first electrode 203 is a cathode, and the second electrode 204 is an anode. According to requirements, the driving transistor 202 further comprises a selection transistor, a storage capacitance and other components, and detailed descriptions will be omitted here, which are not restrictions to the present disclosure.

Figure 6:
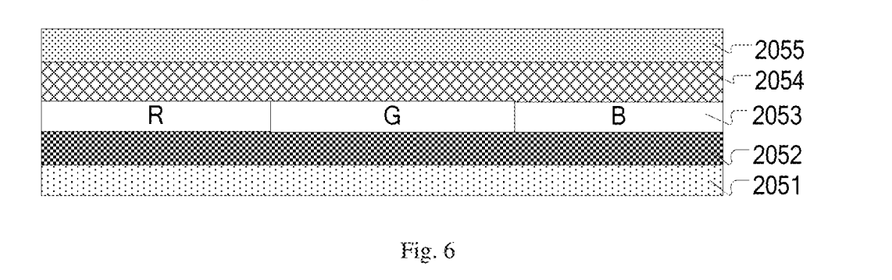
FIG. 6 is a schematic diagram of a sectional structure of an organic functional layer provided by at least one embodiment of the present disclosure.

For example, FIG. 6 is a schematic diagram of a sectional structure of an organic functional layer provided by at least one embodiment of the present disclosure. As illustrated in FIG. 6, the organic functional layer 205, for example, is an organic light-emitting layer, or the organic functional layer 205 comprises a hole injection layer 2051 and an organic light-emitting layer 2053 which are stacked.

For example, as illustrated in FIG. 6, the organic functional layer 205 further comprises a hole transport layer 2052 disposed between the hole injection layer 2051 and the organic light-emitting layer 2053, and an electron transport layer 2054 and an electron injection layer 2055 disposed on the organic light-emitting layer 2053 in sequence. It is understood that, in order to satisfy the requirements on light-emitting of different colors and brightness, the number of layers of the organic functional layers or the order of printing can be changed.

The organic light-emitting layer, for example, includes a mixture of a matrix material and a light-emitting material. The light-emitting material is a fluorescent material or a phosphorescent material. In the embodiments of the present disclosure, a material for emitting red light comprises 9,10-di(2-naphthyl) anthracene (ADN) and (2,6-di [(4'-methooxydiphenylamino) styryl-1,5-]dicyano naphthalene: BSN) (having a weight percentage of 30%); a material for emitting green light comprises 9,10-di(2-naphthyl) anthracene (ADN) and coumarin 6 (having a weight percentage of 5%); a material for emitting blue light comprises 9,10-di(2-naphthyl) anthracene (ADN) and (4,4'-di[2-[4-(N,N-diphenylamino)phenyl]-vinyl]biphenyl: DPAVBi), (having a weight percentage of 2.5%).

For example, the hole injection layer is made of polyaniline conducting polymers or polythiophene conducting polymers with at least one of alcohols, ethers and esters.

For example, the hole injection layer is made of at least one of poly (3, 4-ethylene dioxygen thiophene)—polystyrene sulfonic acid (PEDOT/PSS), polythiophene and polyaniline And the hole injection layer is further made of at least one of tri[4-(5-phenyl-2-thiophene) phenyl] amine, 4,4',4"-tri[2-naphthyl (phenyl) amino] triphenylamine (2-TNATA) or 4,4',4"-tri(3-methyl phenyl aniline) triphenylamine (m-MTDATA), copper phthalocyanine (CuPc) and TPD.

For example, a third contact angle of the material of the hole injection layer on the base definition layer is about 0 to 50 degrees. For example, the third contact angle is 0 degree, 20 degrees, 25 degrees, 30 degrees, 35 degrees, 40 degrees or 50 degrees. A fourth contact angle of the material of the hole injection layer on the first definition layer is 30 to 90 degrees, for example, the fourth contact angle is 30 degrees, 40 degrees, 50 degrees, 60 degrees, 80 degrees or 90 degrees. A fifth contact angle of the hole injection layer on the second definition layer is 30 to 90 degrees, for example, the fifth contact angle is 30 degree, 40 degrees, 50 degrees, 60 degrees, 80 degrees or 90 degrees. The difference between the fourth contact angle and the fifth contact angle is 0 to 10 degrees, for example, the difference between the contact angle that the material of the hole injection layer on the first definition layer and the contact angle that the material of the hole injection layer on the second definition layer is 0 degree, 2 degrees, 4 degrees, 6 degrees, 8 degrees or 10 degrees.

It should be noted that, in a case that the pixel definition layer directly contacts with the hole transport layer, the light-emitting layer, or other layers, or a laminated structure of the films, the first definition layer and/or the second definition layer are arranged on a side surface of at least one opening of the base definition layer based on a same concept, thereby the contact angle between the pixel definition layer and the contact layer that the pixel definition layer contacts is changed, to enhance the matching degree of the two layers. The materials of the base definition layer, the first definition layer and the second definition layer are selected according to requirements, which is not limited here.

Figure 7:
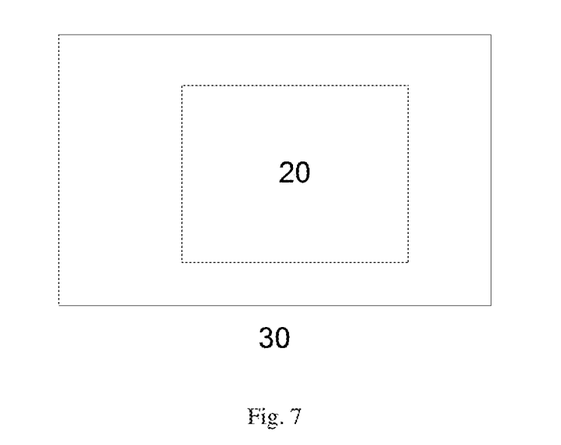
FIG. 7 is a block diagram of a display apparatus provided by at least one embodiment of the present disclosure.

At least one embodiment of the present disclosure further provides a display apparatus, and the display apparatus comprises: any one of the organic light-emitting device described above. For example, FIG. 7 is a block diagram of a display apparatus provided by at least one embodiment of the present disclosure. As illustrated in FIG. 7, the display apparatus 30 includes the organic light-emitting device 20.

For example, other structures of the display apparatus 30 refer to conventional designs. For example, the display apparatus is: a mobile phone, a tablet computer, a television, a display, a notebook computer, a digital picture frame, a navigation system and any other product or component having a display function. Other necessary components of the display apparatus which should be understood by those skilled in the art are included, the description for which is omitted here, and should not be construed as a restriction to the present disclosure. The implementation of the display apparatus refers to the embodiments of the above-mentioned opposite substrate, and detailed descriptions will be omitted here.

Figure 8:
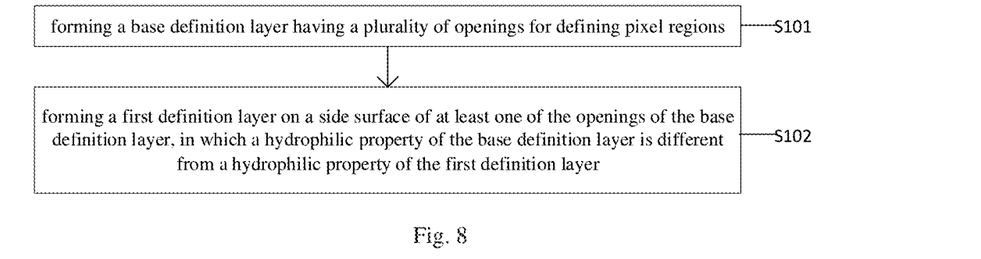
FIG. 8 is a flow chart of a method for manufacturing a pixel definition layer provided by at least one embodiment of the present disclosure.

At least one embodiment of the present disclosure further provides a manufacturing method of a pixel definition layer, and for example, FIG. 8 is a flow chart of a method for manufacturing a pixel definition layer provided by at least one embodiment of the present disclosure. As illustrated in FIG. 8, the manufacturing method comprises the following operations:

S101: forming a base definition layer having a plurality of openings for defining pixel regions;

S102: forming a first definition layer on a side surface of at least one of the openings of the base definition layer, in which a hydrophilic property of the base definition layer is different from a hydrophilic property of the first definition layer.

For example, the method further comprises: forming a second definition layer on a side surface of at least one of the openings of the base definition layer, the hydrophilic property of the base definition layer, the hydrophilic property of the first definition layer, and a hydrophilic property of the second definition layer are different from each other.

For example, the first definition layer and the second definition layer are disposed in different openings to adapt to the hole injection layers corresponding to light-emitting layers made of different materials. For example, the first definition layer and the second definition layer are disposed in the openings adjacent to each other, in this way, the first definition layer and the second definition layer are formed on both sides of a sub-structure of the base definition layer between the two adjacent openings, and the first definition layer and the second definition layer are disposed in the openings not adjacent to each other.

The pixel definition layer further comprises: a third definition layer arranged on a side surface of another opening of the base definition layer. The openings, in which the first definition layer, the second definition layer and the third definition layer are disposed, are arranged in sequence or spaced apart from each other. For example, the material of the first definition layer, the material of the second definition layer and the material of the third definition layer are different from each other.

It should be noted that, the first definition layer and the second definition layer are relative, as long as the material of the first definition layer is different from the material of the second definition layer, and the first definition layer and the second definition layer are formed in different openings. One of them is called as the first definition layer and the other one is called as the second definition layer, and this rule also applies to the third definition layer. The following takes the first definition layer and the second definition layer for example, and the embodiments of the present disclosure are not limited to the situation.

For example, a material of the base definition layer comprises a hydrophilic material or a first hydrophobic material, a material of the first definition layer comprises a second hydrophobic material, and a material of the second definition layer comprises a third hydrophobic material.

For example, all of the first hydrophobic material, the second hydrophobic material and the third hydrophobic material comprise at least one of fluorinated polyimide, fluorinated polymethyl methacrylate and fluorinated organosilicon. For example, the first hydrophobic material, the second hydrophobic material and the third hydrophobic material are selected from a same selection range, but the specific components are different, the difference in components includes the selected of different base materials, or the base materials are the same, but fluorination rates are different.

For example, in a case that the first hydrophobic material, the second hydrophobic material and the third hydrophobic material are only different from each other in fluorination rate, a ratio of fluorinated group to non-fluorinated group of the first hydrophobic material is less than that of the second hydrophobic material and that of the third hydrophobic material.

For example, in a case that the first hydrophobic material, the second hydrophobic material and the third hydrophobic material are all selected from polyimide, a ratio of fluorinated group to non-fluorinated group of the first hydrophobic material is (0.8 to 1.2):10, a ratio of fluorinated group to non-fluorinated group of the second hydrophobic material is (1.8 to 2.2):10, a ratio of fluorinated group to non-fluorinated group of the third hydrophobic material is (2.8 to 3.2):10.

For example, in a case that the base materials of the first hydrophobic material, the second hydrophobic material and the third hydrophobic material are selected from polymethyl methacrylate or organosilicon, the ratio of fluorinated group to non-fluorinated group of the first hydrophobic material is (0.8 to 1.2):10, the ratio of fluorinated group to non-fluorinated group of the second hydrophobic material is (1.8 to 2.2):10, the ratio of fluorinated group to non-fluorinated group of the third hydrophobic material is (2.8 to 3.2):10, respectively.

For example, in at least one embodiment of the present disclosure, the hydrophilic material comprises an inorganic hydrophilic material or an organic hydrophilic material, the inorganic hydrophilic material comprises at least one of $SiO_2$, $SiN_x$ and $SiON_x$, and the organic hydrophilic material comprises at least one of polyimide, polymethyl methacrylate and organosilicon resin.

Figure 9:
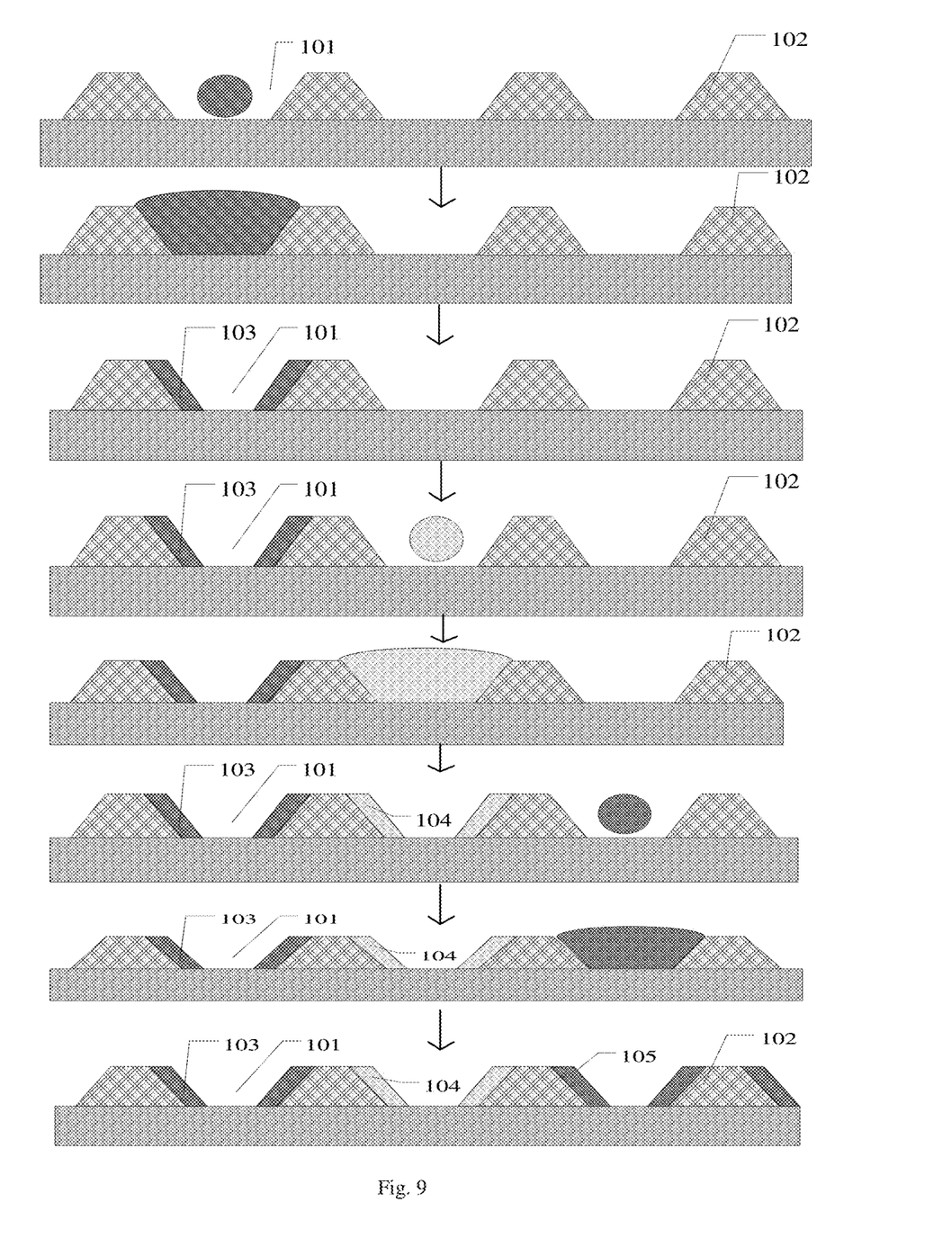
FIG. 9 is a process diagram of the method for manufacturing the pixel definition layer provided by at least one embodiment of the present disclosure.

For example, FIG. 9 is a process diagram of the method for manufacturing the pixel definition layer provided by at least one embodiment of the present disclosure. As illustrated in FIG. 9, a base definition layer film is formed by a spin coating method or a slit coating method, then a pattern of the base definition layer 103 is formed by a patterning process including exposure and development; a first definition layer film is formed on at least one openings of the base definition layer by an inkjet printing method, and then the first definition layer 103 is formed by a patterning process including exposure and development. The pixel definition layer with this structure adapts to the hole injection layers formed by more materials.

As illustrated in FIG. 9, the above manufacturing process is repeated in turn to form a second definition layer 104 on a side surface of at least one opening. For example, as illustrated in FIG. 9, a third definition layer 105 is formed in the third opening.

For example, the first definition layer, the second definition layer and the third definition layer are formed in a same patterning process. For example, FIG. 10 is another process diagram of the method for manufacturing the pixel definition layer provided by at least one embodiment of the present disclosure.

For example, a base definition layer film is formed by the spin coating method or the slit coating method, then a pattern of a base definition layer is formed by a patterning process including exposure and development; a first definition layer film, a second definition layer film and a third definition layer film are formed on the openings of the base definition layer by the inkjet printing method, and then the first definition layer, the second definition layer and the third definition layer are formed by a patterning process including exposure and development. The pixel definition layer with this structure adapts to the hole injection layers formed by more materials.

Figure 10:
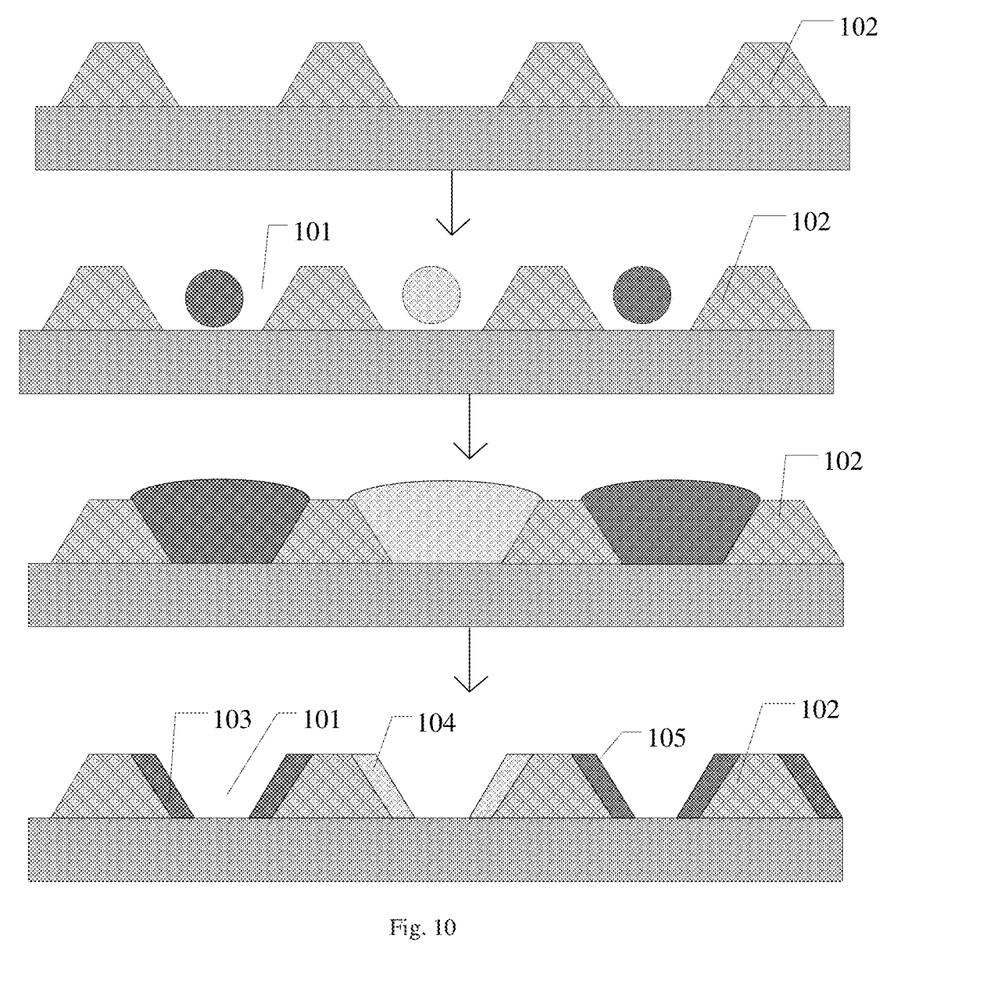
FIG. 10 is another process diagram of the method for manufacturing the pixel definition layer provided by at least one embodiment of the present disclosure.

For example, in the production process as illustrated in FIG. 10, in a case that the base material of the first definition layer, the base material of the second definition layer and the base material of the third definition layer are the same, and a fluorination rate of the base material of the first definition layer is different from a fluorination rate of the base material of the second definition layer or a fluorination rate of the base material of the third definition layer, same exposure condition and same development condition can be used.

For example, in at least one embodiment of the present disclosure, before patterning the base definition layer film, the first definition layer film, the second definition layer film and the third definition layer film, the base definition layer film, the first definition layer film, the second definition layer film and the third definition layer film are preheated respectively. The preheating temperature is about 80° C. to 150° C., for example, the preheating temperature is 80° C., 100°

C., 120° C., 130° C. or 150° C. The preheating time is about 80 to 200 seconds (s), for example, the preheating time is 80 s, 100 s, 160 s or 200 s.

At least one embodiment of the present disclosure further provides a manufacturing method of an organic light-emitting device, and the method further comprises: providing a base substrate; forming any one of the pixel definition layers described above on the base substrate; and forming an organic functional layer in the plurality of openings of the base definition layer.

For example, in the manufacturing method provided by the embodiment of the present disclosure, the organic functional layer is only an organic light-emitting layer, or the organic functional layer comprises a hole injection layer and an organic light-emitting layer which are stacked.

For example, the organic functional layer further comprises a hole transport layer disposed between the hole injection layer and the organic light-emitting layer, and an electron transport layer and an electron injection layer disposed on the organic light-emitting layer in sequence. It is understood that, in order to satisfy the requirements on light-emitting of different colors and brightness, the number of layers of the organic functional layers or the order of printing can be changed.

The organic light-emitting layer, for example, includes a mixture of a matrix material and a light-emitting material. The light-emitting material is a fluorescent material or a phosphorescent material. In the embodiments of the present disclosure, a material for emitting red light comprises 9,10-di(2-naphthyl) anthracene (ADN) and (2,6-di [(4'-methooxydiphenylamino) styryl-1,5-]dicyano naphthalene: BSN) (having a weight percentage of 30%); a material for emitting green light comprises 9,10-di(2-naphthyl) anthracene (ADN) and coumarin 6 (having a weight percentage 5%); a material for emitting blue light comprises 9,10-di(2-naphthyl) anthracene (ADN) and (4,4'-di[2-[4-(N,N-diphenylamino)phenyl]-vinyl]biphenyl: DPAVBi), (having a weight percentage of 2.5%).

For example, the hole injection layer is and polyaniline conducting polymers or polythiophene conducting polymers with made of at least one of alcohols, ethers and esters.

For example, the hole injection layer is made of at least one of poly (3, 4-ethylene dioxygen thiophene)—polystyrene sulfonic acid (PEDOT/PSS), polythiophene and polyaniline And the hole injection layer is further made of at least one of tri[4-(5-phenyl-2-thiophene) phenyl] amine, 4,4',4"-tri[2-naphthyl (phenyl) amino] triphenylamine (2-TNATA) or 4,4',4"-tri(3-methyl phenyl aniline) triphenylamine (m-MTDATA), copper phthalocyanine (CuPc) and TPD.

For example, in the manufacturing method provided by at least one embodiment of the present disclosure, a contact angle of the material of the organic light-emitting layer or the hole injection layer on the base definition layer is about 0 to 50 degrees. For example, the contact angle is 0 degree, 20 degrees, 25 degrees, 30 degrees, 35 degrees, 40 degrees or 50 degrees. A contact angle of the material of the hole injection layer on the first definition layer and/or the second definition layer is 30 to 90 degrees, for example, the contact angle is 30 degrees, 40 degrees, 50 degrees, 60 degrees, 80 degrees or 90 degrees. The difference between the contact angle that the material of the hole injection layer on the first definition layer and the contact angle that the material of the hole injection layer on the second definition layer is 0 to 10 degrees, for example, the difference between the contact angle that the material of the hole injection layer on the first definition layer and the contact angle that the material of the hole injection layer on the second definition layer is 0 degree, 2 degrees, 4 degrees, 6 degrees, 8 degrees or 10 degrees.

Embodiments of the present disclosure relate to a pixel definition layer and its manufacturing method, an organic light-emitting device and its manufacturing method, and a display apparatus, which have at least one beneficial effect as following.

(1) The pixel definition layer provided by at least one embodiment of the present disclosure, the first definition layer is arranged on a side surface of at least one of the openings of the base definition layer, and the material of the base definition layer is different from the material of the first definition layer, the pixel definition layer adapts to the hole injection layer formed by different materials more widely, and the hole injection layer can become more even;

(2) the pixel definition layer provided by at least one embodiment of the present disclosure, the light-emitting efficiency of the organic light-emitting device is improved and the life of the organic light-emitting device is prolonged.

Please note the following points that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. A pixel definition layer, comprising:
a base definition layer having a plurality of openings for defining pixel regions,
a first definition layer arranged on a side surface of at least one of the openings of the base definition layer, wherein a hydrophilic property of the base definition layer is different from a hydrophilic property of the first definition layer, and
a second definition layer arranged on a side surface of at least one of the openings of the base definition layer, the hydrophilic property of the base definition layer, the hydrophilic property of the first definition layer, and a hydrophilic property of the second definition layer are different from each other,
wherein a material of the base definition layer comprises a hydrophilic material or a first hydrophobic material, a material of the first definition layer comprises a second hydrophobic material, and a material of the second definition layer comprises a third hydrophobic material.

2. The pixel definition layer according to claim 1, wherein the first hydrophobic material comprises at least one of fluorinated polyimide, fluorinated polymethyl methacrylate and fluorinated organo silicon;
the second hydrophobic material comprises at least one of fluorinated polyimide, fluorinated polymethyl methacrylate and fluorinated organosilicon; and the third hydrophobic material comprises at least one of fluorinated polyimide, fluorinated polymethyl methacrylate and fluorinated organosilicon.

3. The pixel definition layer according to claim 2, wherein the first hydrophobic material is same as the second hydrophobic material or the third hydrophobic material in base material but different from the second hydrophobic material or the third hydrophobic material in fluorination rate,
a ratio of fluorinated group to non-fluorinated group of the first hydrophobic material is less than that of the second hydrophobic material and that of the third hydrophobic material.

4. The pixel definition layer according to claim 1, wherein the hydrophilic material comprises an inorganic hydrophilic material or an organic hydrophilic material,
the inorganic hydrophilic material comprises at least one of $SiO_2$, $SiN_x$ and $SiON_x$, and the organic hydrophilic material comprises at least one of polyimide, polymethyl methacrylate and organosilicon resin.

5. The pixel definition layer according to claim 1, wherein a first contact angle of deionized water on the base definition layer is less than a second contact angle of deionized water on the first definition layer or the second definition layer, and the second contact angle is larger than the first contact angle by 30 to 90 degrees.

6. The pixel definition layer according to claim 5, wherein a thickness of the base definition layer is from 3 μm to 50 μm, and thicknesses of the first definition layer and the second defined layer are from 1 μm to 3 μm.

7. The pixel definition layer according to claim 5, further comprising: a third definition layer arranged on a side surface of at least one of the openings of the base definition layer, wherein the openings, in which the first definition layer, the second definition layer and the third definition layer are arranged respectively, are arranged in sequence or spaced apart from each other.

8. An organic light-emitting device, comprising:
a base substrate;
the pixel definition layer according to claim 1 is arranged on the base substrate; and
an organic functional layer disposed in the plurality of openings of the base definition layer.

9. The organic light-emitting device according to claim 8, wherein the organic functional layer comprises a hole injection layer and an organic light-emitting layer which are stacked.

10. The organic light-emitting device according to claim 9, wherein a material of the hole injection layer comprises polyaniline conducting polymers or polythiophene conducting polymers with at least one of alcohols, ethers and esters.

11. The organic light-emitting device according to claim 10, wherein a third contact angle of the material of the hole injection layer on the base definition layer is 0 to 50 degrees, a fourth contact angle of the material of the hole injection layer on the first definition layer is 30 to 90 degrees, a fifth contact angle of the hole injection layer on the second definition layer is 30 to 90 degrees, and a difference between the fourth contact angle and the fifth contact angle is 0 to 10 degrees.

12. A display apparatus, comprising: the organic light-emitting device according to claim 8.

13. A manufacturing method of a pixel definition layer, comprising:
forming a base definition layer having a plurality of openings for defining pixel regions,
forming a first definition layer on a side surface of at least one of the openings of the base definition layer, wherein a hydrophilic property of the base definition layer is different from a hydrophilic property of the first definition layer, and
forming a second definition layer on a side surface of at least one of the openings of the base definition layer, wherein the hydrophilic property of the base definition layer, the hydrophilic property of the first definition layer, and a hydrophilic property of the second definition layer are different from each other,
wherein a material of the base definition layer comprises a hydrophilic material or a first hydrophobic material, a material of the first definition layer comprises a second hydrophobic material, and a material of the second definition layer comprises a third hydrophobic material.

14. A manufacturing method of an organic light-emitting device, comprising:
providing a base substrate;
forming the pixel definition layer according to claim 1 on the base substrate; and
forming an organic functional layer in the plurality of openings of the base definition layer.

15. The manufacturing method according to claim 14, wherein the organic functional layer comprises a hole injection layer and an organic light-emitting layer which are stacked arranged.

16. The manufacturing method according to claim 15, wherein a third contact angle of a material of the hole injection layer on the base definition layer is 0 to 50 degrees, a fourth contact angle of the material of the hole injection layer on the first definition layer is 30 to 90 degrees, a fifth contact angle of the hole injection layer on the second definition layer is 30 to 90 degrees, and a difference between the fourth contact angle and the fifth contact angle is 0 to 10 degrees.

* * * * *